United States Patent
Yamashita et al.

(10) Patent No.: US 10,439,085 B2
(45) Date of Patent: Oct. 8, 2019

(54) MANUFACTURING METHOD FOR SOLAR CELL MODULE PROVIDED WITH MULTIPLE SOLAR CELLS CONNECTED BY TAB LINES AND SOLAR CELL MODULE MANUFACTURED BY SAME

(71) Applicant: Panasonic Intellectual Property Management Co., Ltd., Osaka (JP)

(72) Inventors: Mamoru Yamashita, Osaka (JP); Masao Kouyanagi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 23 days.

(21) Appl. No.: 15/444,618

(22) Filed: Feb. 28, 2017

(65) Prior Publication Data
US 2017/0179319 A1    Jun. 22, 2017

Related U.S. Application Data
(63) Continuation of application No. PCT/JP2015/004165, filed on Aug. 20, 2015.

(30) Foreign Application Priority Data
Aug. 29, 2014    (JP) ................................ 2014-175420

(51) Int. Cl.
*H01L 31/048*    (2014.01)
*H01L 31/05*    (2014.01)
(Continued)

(52) U.S. Cl.
CPC ........ *H01L 31/048* (2013.01); *H01L 31/0488* (2013.01); *H01L 31/05* (2013.01);
(Continued)

(58) Field of Classification Search
CPC ... H01L 31/048; H01L 31/0488; H01L 31/05; H01L 31/0504; H01L 31/0508; H02S 40/34; H02S 40/36
See application file for complete search history.

(56) References Cited

U.S. PATENT DOCUMENTS 6,066,796 A * 5/2000 Itoyama ............ H01L 31/02008
                                                136/251
6,469,242 B1 * 10/2002 Kondo ..................... B32B 17/02
                                                136/244

(Continued)

FOREIGN PATENT DOCUMENTS

JP    2003-324211 A    11/2003
JP    2005-079170 A    3/2005
(Continued)

OTHER PUBLICATIONS

Written Opinion and Search Report issued in corresponding International Patent Application No. PCT/JP2015/004165, dated Mar. 3, 2016.

*Primary Examiner* — Edward J. Schmiedel
(74) *Attorney, Agent, or Firm* — McDermott Will & Emery LLP

(57) ABSTRACT

In a solar cell module, a first encapsulant and a second encapsulant are provided between a first protective member and a second protective member, and solar cells are provided between the first encapsulant and the second encapsulant. A connecting tab wire cover is laminated on the first encapsulant. A connecting tab wire encapsulant is laminated on the connecting tab wire cover. The multiple solar cells are laminated on the first encapsulant. Through a slit formed on the connecting tab wire encapsulant, fixing members fix a connecting tab wire, which connects multiple solar cells, and the connecting tab wire cover.

7 Claims, 10 Drawing Sheets

(51) Int. Cl.
*H02S 40/34* (2014.01)
*H02S 40/36* (2014.01)

(52) U.S. Cl.
CPC ...... *H01L 31/0504* (2013.01); *H01L 31/0508* (2013.01); *H02S 40/34* (2014.12); *H02S 40/36* (2014.12); *Y02E 10/50* (2013.01)

(56) References Cited

U.S. PATENT DOCUMENTS

| | | | |
|---|---|---|---|
| 9,306,081 B2 * | 4/2016 | Kudoh | H01L 31/048 |
| 2005/0000562 A1 * | 1/2005 | Kataoka | H01L 31/048 |
| | | | 136/251 |
| 2009/0014060 A1 * | 1/2009 | Nakatani | H01L 31/042 |
| | | | 136/251 |
| 2009/0032101 A1 * | 2/2009 | Kempe | C08K 5/14 |
| | | | 136/259 |
| 2010/0147357 A1 * | 6/2010 | Yagiura | H01L 31/02008 |
| | | | 136/244 |
| 2012/0152328 A1 * | 6/2012 | Aou | H01L 31/048 |
| | | | 136/251 |
| 2014/0209167 A1 | 7/2014 | Yamada et al. | |

FOREIGN PATENT DOCUMENTS

| | | |
|---|---|---|
| JP | 2009-246208 A | 10/2009 |
| WO | 2013/080579 A1 | 6/2013 |

* cited by examiner

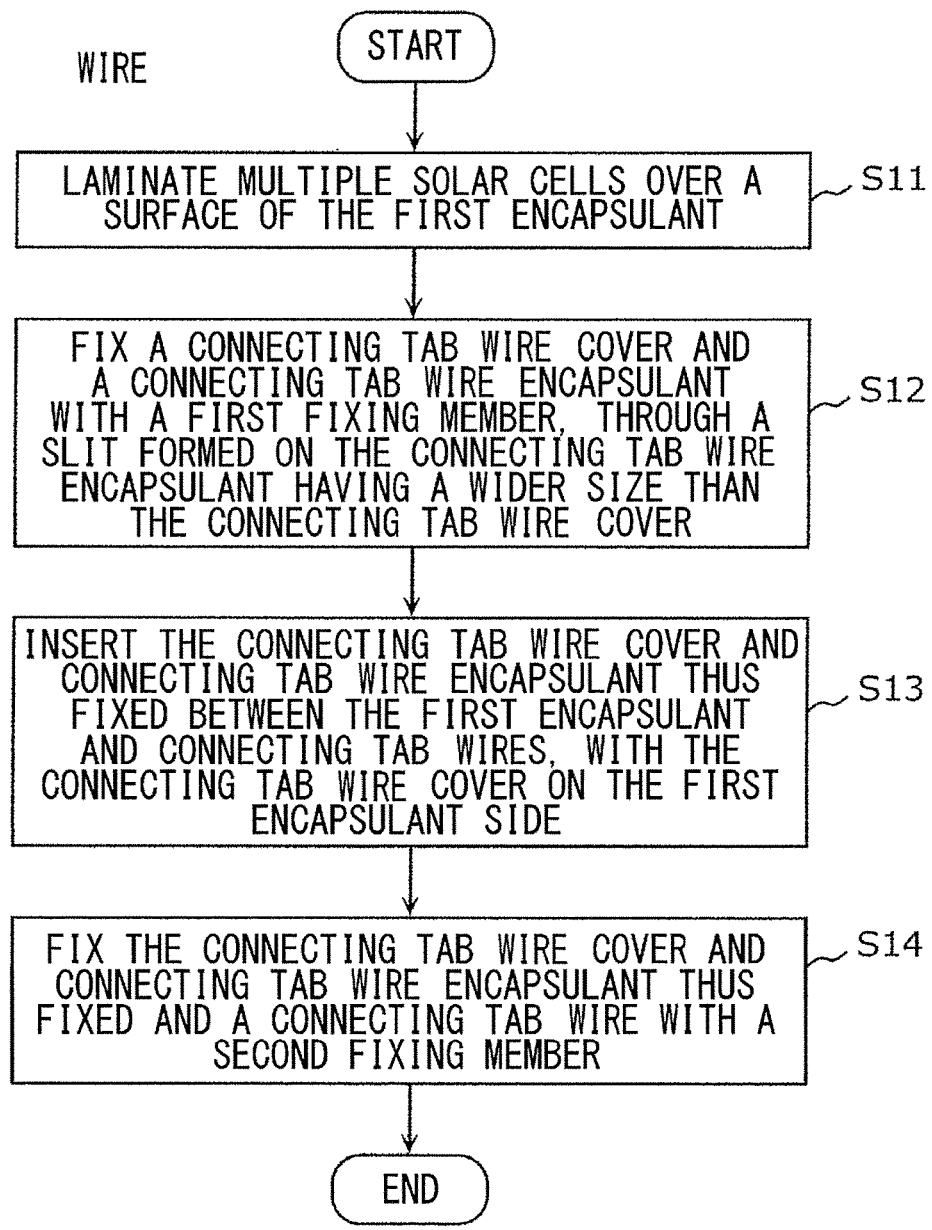

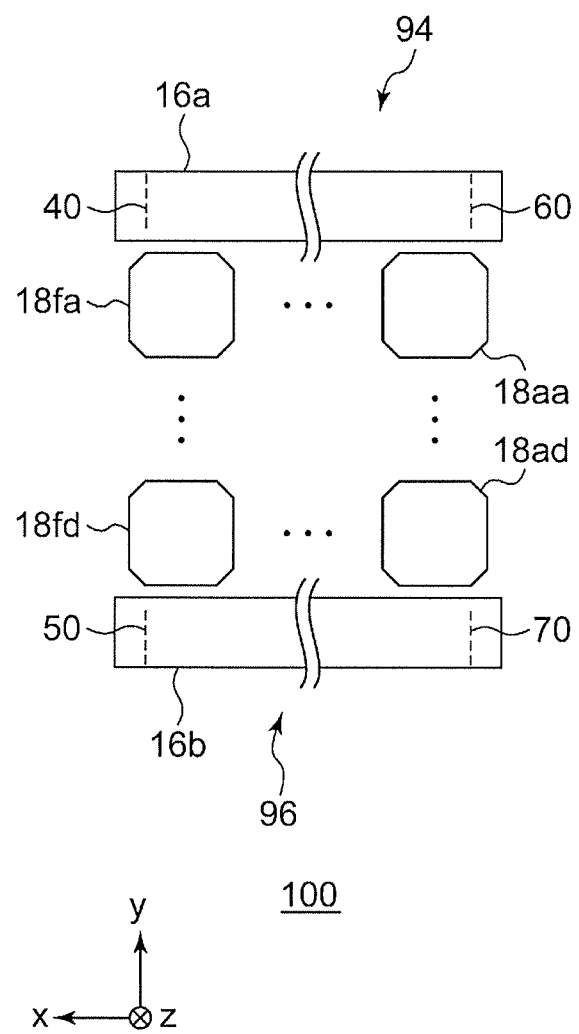

MANUFACTURING METHOD FOR SOLAR CELL MODULE PROVIDED WITH MULTIPLE SOLAR CELLS CONNECTED BY TAB LINES AND SOLAR CELL MODULE MANUFACTURED BY SAME

CROSS-REFERENCE TO RELATED APPLICATION

This application is based upon and claims the benefit of priority from the prior Japanese Patent Application No. 2014-175420, filed on Aug. 29, 2014, the entire contents of which are incorporated herein by reference.

BACKGROUND

1. Field

The disclosure relates to a technique for manufacturing a solar cell module, and particularly to a method for manufacturing a solar cell module provided with multiple solar cells connected by connecting tab wires and to a solar cell module manufactured using the method.

2. Description of the Related Art

In a solar cell module, multiple solar cells as solar cell elements are arranged, and the multiple solar cells are connected to one another by wirings. When such a solar cell module is viewed from the light-receiving surface side, the wirings will be conspicuous in appearance, impairing the design of the solar cell module. To prevent such impairing of appearance by wirings, a cover may be used to hide the wirings, for example (refer to Japanese Unexamined Patent Application Publication No. 2009-246208, for example).

A solar cell module is manufactured by laminating a cover, an encapsulant, and connecting tab wires as wirings in this order. In order to improve reliability of a solar cell module, the encapsulant is desirably larger than the cover (sheet).

However, in a manufacturing process of such a solar cell module, the connecting tab wires and the encapsulant can be fixed with tape, but the connecting tab wires and the cover cannot be fixed with tape. Accordingly, if the solar cell module is moved during the manufacturing, the cover may be dislocated and may be unable to hide the connecting tab wires.

SUMMARY

The present invention has been made in view of such a situation, and a purpose thereof is to provide a technique for preventing dislocation of a cover while ensuring reliability of the solar cell module.

To solve the problem above, an embodiment relates to a method for manufacturing a solar cell module in which a first encapsulant and a second encapsulant are provided between two protective members, and solar cells are provided between the first encapsulant and the second encapsulant, and the method includes: laminating a plurality of solar cells over a surface of the first encapsulant; fixing a connecting tab wire cover and a connecting tab wire encapsulant with a first fixing member, through a slit formed on the connecting tab wire encapsulant having a wider size than the connecting tab wire cover; inserting the connecting tab wire cover and the connecting tab wire encapsulant thus fixed between the first encapsulant and a connecting tab wire for connecting a plurality of solar cells, with the connecting tab wire cover on the first encapsulant side; and fixing the connecting tab wire cover and the connecting tab wire encapsulant thus fixed and the connecting tab wire with a second fixing member.

Another embodiment is a solar cell module. In the solar cell module, a first encapsulant and a second encapsulant are provided between two protective members, and solar cells are provided between the first encapsulant and the second encapsulant, and the solar cell module includes: a connecting tab wire cover laminated on a surface of the first encapsulant; a connecting tab wire encapsulant laminated on the surface opposite to the first encapsulant side of the connecting tab wire cover; a plurality of solar cells laminated over a surface of the first encapsulant; and fixing members that fix, through a slit formed on the connecting tab wire encapsulant having a wider size than the connecting tab wire cover, the connecting tab wire cover and a connecting tab wire, which is provided on the surface opposite to the connecting tab wire cover side of the connecting tab wire encapsulant and is used to connect the plurality of solar cells.

BRIEF DESCRIPTION OF THE DRAWINGS

The figures depict one or more implementations in accordance with the present teaching, by way of example only, not by way of limitations. In the figures, like reference numerals refer to the same or similar elements.

FIG. 5 is a flowchart of a method for manufacturing a solar cell module according to an embodiment;

FIG. 8B is a plan view that shows another modification of the solar cell module shown in FIGS. 6A and 6B.

DETAILED DESCRIPTION

A general description will be given before the present invention is specifically described. An embodiment of the present invention relates to a technique for manufacturing a solar cell module. In a manufacturing process of a solar cell module, a sheet, an encapsulant, connecting tab wires, and the likes are laminated. If the components are moved before a lamination process and a curing process are performed thereon, for example, the sheet may be dislocated from its original position.

In order to prevent such an incident, the sheet should be desirably fixed to the connecting tab wires with tape, because solar cells connected by the connecting tab wires have large resistance and are less likely to be dislocated accordingly. However, when the encapsulant is larger than the sheet, the connecting tab wires and the sheet, which are laminated with the encapsulant therebetween, cannot be fixed with tape, as described previously. The present embodiment is aimed at preventing dislocation of the sheet (cover) even in such a situation. In the present embodiment, slits are provided on an encapsulant, and, through the slits, a sheet and connecting tab wires are fixed with tape.

Figure 1:
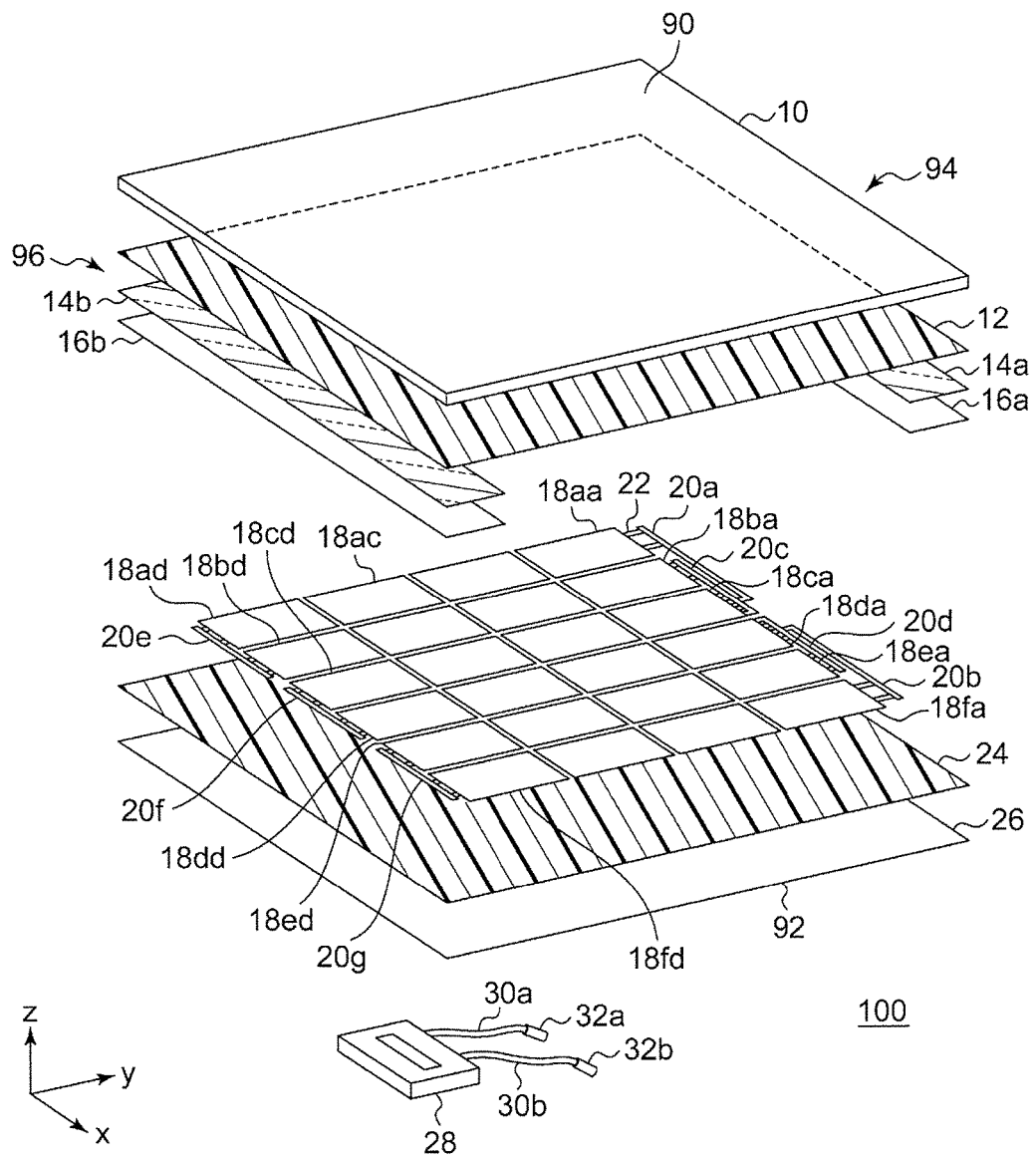
FIG. 1 is an exploded perspective view that shows a configuration of a solar cell module according to an embodiment.
Figure 2:
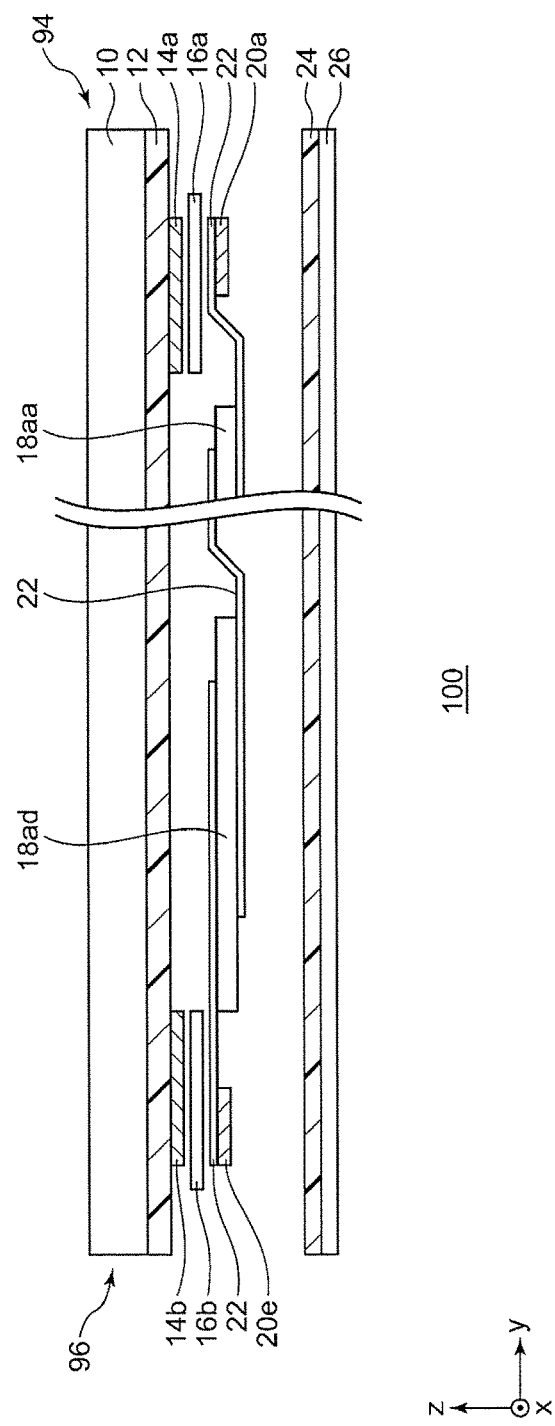
FIG. 2 is a sectional view of the solar cell module shown in FIG. 1 taken along the y-axis.

FIG. 1 is an exploded perspective view that shows a configuration of a solar cell module 100 according to an embodiment. As shown in FIG. 1, a Cartesian coordinate system is defined by the x-axis, y-axis, and z-axis. The x-axis and y-axis are perpendicular to each other within a plane of the solar cell module 100. The z-axis is perpendicular to the x-axis and y-axis and extends in the thickness direction of the solar cell module 100. The positive directions of the x-axis, y-axis, and z-axis are defined as the respective arrow directions shown in FIG. 1, and the negative directions thereof are defined as the directions opposite to the respective arrow directions. Also, the upper side in FIG. 1 is the side of a light-receiving surface 90, on which sunlight is incident, of the solar cell module 100, and the lower side in FIG. 1 is the side of a back surface 92 of the solar cell module 100. Further, the end of the solar cell module 100 on the positive direction side of the y-axis is a reference side 94, and the end of the solar cell module 100 on the negative direction side of the y-axis is an opposite reference side 96. FIG. 2 is a sectional view of the solar cell module 100 taken along the y-axis. The sectional view of FIG. 2 is viewed from the positive direction side of the x-axis.

The solar cell module 100 comprises: a first protective member 10; a first encapsulant 12; a first connecting tab wire cover 14a and a second connecting tab wire cover 14b, which are collectively referred to as connecting tab wire covers 14; a first connecting tab wire encapsulant 16a and a second connecting tab wire encapsulant 16b, which are collectively referred to as connecting tab wire encapsulants 16; an 11th solar cell 18aa, a 13th solar cell 18ac, a 14th solar cell 18ad, a 21st solar cell 18ba, a 24th solar cell 18bd, a 31st solar cell 18ca, a 34th solar cell 18cd, a 41st solar cell 18da, a 44th solar cell 18dd, a 51st solar cell 18ea, a 54th solar cell 18ed, a 61st solar cell 18fa, and a 64th solar cell 18fd, which are collectively referred to as solar cells 18; a first connecting tab wire 20a, a second connecting tab wire 20b, a third connecting tab wire 20c, a fourth connecting tab wire 20d, a fifth connecting tab wire 20e, a sixth connecting tab wire 20f, and a seventh connecting tab wire 20g, which are collectively referred to as connecting tab wires 20; tab lines 22; a second encapsulant 24; a second protective member 26; a terminal box 28; a first connection cable 30a and a second connection cable 30b, which are collectively referred to as connection cables 30; and a first connection plug 32a and a second connection plug 32b, which are collectively referred to as connection plugs 32.

The first protective member 10 is arranged on the light-receiving surface 90 side so as to protect the surface of the solar cell module 100. For the first protective member 10, translucent and water-impermeable glass, translucent plastics, or the like is used and formed into a rectangle plate. The first encapsulant 12 is laminated on the surface opposite to the light-receiving surface 90 of the first protective member 10. This corresponds to the first encapsulant 12 being laminated on the negative direction side of the z-axis of the first protective member 10. The first encapsulant 12 is arranged between the first protective member 10 and the connecting tab wire covers 14, which will be described later, or the solar cells 18 so as to bond the components together.

For the first encapsulant 12, a thermoplastic resin, such as a resin film of ethylene-vinyl acetate copolymer (EVA), polyvinyl butyral (PVB), and polyimide, may be used, for example. A thermosetting resin may also be used. The first encapsulant 12 has translucency and is formed of a rectangle sheet material of which the dimensions of a surface are substantially identical with those of the x-y plane of the first protective member 10.

The connecting tab wire covers 14 are laminated on the surface opposite to the first protective member 10 side of the first encapsulant 12. This corresponds to the connecting tab wire covers 14 being laminated on the negative direction side of the z-axis of the first encapsulant 12. The connecting tab wire covers 14 include the first connecting tab wire cover 14a arranged on the reference side 94 and the second connecting tab wire cover 14b arranged on the opposite reference side 96. In this way, the first connecting tab wire cover 14a and second connecting tab wire cover 14b are arranged to be opposite to each other in the y-axis direction, with the multiple solar cells 18 therebetween.

The size of the connecting tab wire covers 14 is determined so that the connecting tab wire covers 14 can cover the connecting tab wires 20 for connecting multiple solar cells 18, which will be described later, and the first connecting tab wire cover 14a and second connecting tab wire cover 14b have the same size. The dimension in the x-axis direction of the first connecting tab wire cover 14a and second connecting tab wire cover 14b is set to be longer than the length between one end and the other end of multiple connecting tab wires 20 arranged in the x-axis direction. Also, the dimension in the y-axis direction of the first connecting tab wire cover 14a and second connecting tab wire cover 14b is set to be longer than the length from a solar cell 18 closest to the reference side 94 to a connecting tab wire 20 closest to the reference side 94.

The connecting tab wire covers 14 are provided so as to make the connecting tab wires 20 indistinctive when the solar cell module 100 is viewed from the light-receiving surface 90 side. Accordingly, the connecting tab wire covers 14 are colored in the same color as or a similar color to the colors of the second protective member 26 and the second encapsulant 24, which will be described later, viewed from the light-receiving surface 90 side. The connecting tab wire covers 14 may be formed of synthetic resin, such as polyethylene terephthalate (PET), polyethylene naphthalate (PEN), and polyvinyl fluoride (PVF), or a combination thereof.

The connecting tab wire encapsulants 16 are laminated on the surface opposite to the first encapsulant 12 side of the respective connecting tab wire covers 14. This corresponds to the connecting tab wire encapsulants 16 being laminated on the negative direction side of the z-axis of the connecting tab wire covers 14. The connecting tab wire encapsulants 16 include the first connecting tab wire encapsulant 16a arranged on the reference side 94 and laminated on the first connecting tab wire cover 14a, and the second connecting tab wire encapsulant 16b arranged on the opposite reference side 96 and laminated on the second connecting tab wire cover 14b.

The size of the connecting tab wire encapsulants 16 is set to be wider than the connecting tab wire covers 14, in order to strengthen the adhesion of the connecting tab wire encapsulants 16 and improve the reliability of the solar cell module 100. Since the size of the connecting tab wire encapsulants 16 is set in this way, although the connecting tab wire covers 14 and connecting tab wires 20 are arranged in the z-axis direction with the connecting tab wire encapsulants 16 therebetween, the connecting tab wire covers 14 and the connecting tab wires 20 are not directly in contact with each other. The connecting tab wire encapsulants 16 are formed of material similar to that of the first encapsulant 12.

The multiple solar cells 18 are laminated on the surface opposite to the first protective member 10 side of the first encapsulant 12. This corresponds to the multiple solar cells 18 being laminated on the negative direction side of the z-axis of the first encapsulant 12, similarly to the connecting tab wire covers 14. Each of the solar cells 18 absorbs incident light and generates photovoltaic power. The solar cells 18 are formed of a semiconductor material, such as crystalline silicon, gallium arsenide (GaAs), and indium phosphide (InP). The structure of the solar cells 18 is not particularly limited, and, as an example, lamination of crystalline silicon and amorphous silicon is assumed in the embodiment.

The multiple solar cells 18 are arranged in a matrix on the x-y plane. In this example, six solar cells 18 are arranged in the x-axis direction, and four solar cells 18 are arranged in the y-axis direction. Two solar cells 18 adjacent to each other in the y-axis direction are connected by tab lines 22. In FIG. 1, the tab lines 22 arranged on the solar cells 18 are not illustrated. The tab lines 22 arranged on the solar cells 18 will be detailed later with reference to FIG. 3. The 21st solar cell 18*ba* and the 31st solar cell 18*ca* are connected to the third connecting tab wire 20*c* via tab lines 22, and the 41st solar cell 18*da* and the 51st solar cell 18*ea* are connected to the fourth connecting tab wire 20*d* via tab lines 22. Also, the 11th solar cell 18*aa* is connected to the first connecting tab wire 20*a* via tab lines 22, and the 61st solar cell 18*fa* is connected to the second connecting tab wire 20*b* via tab lines 22. Further, the 14th solar cell 18*ad* and the 24th solar cell 18*bd* are connected to the fifth connecting tab wire 20*e* via tab lines 22. The 34th solar cell 18*cd* and the 44th solar cell 18*dd* are connected to the sixth connecting tab wire 20*f* via tab lines 22. The 54th solar cell 18*ed* and the 64th solar cell 18*fd* are connected to the seventh connecting tab wire 20*g* via tab lines 22.

The second encapsulant 24 is laminated on the surface opposite to the first protective member 10 side of the first encapsulant 12. This corresponds to the second encapsulant 24 being laminated on the negative direction side of the z-axis of the first encapsulant 12, similarly to the connecting tab wire covers 14 and solar cells 18. With such arrangement, the second encapsulant 24 and the first encapsulant 12 seal the multiple solar cells 18, connecting tab wire encapsulants 16, and connecting tab wire covers 14 therebetween. For the second encapsulant 24, material similar to that of the first encapsulant 12 may be used. However, unlike the first encapsulant 12, the second encapsulant 24 need not have translucency, and material colored in white, black, or the like may be used for the second encapsulant 24.

The second protective member 26 is laminated on the surface opposite to the first encapsulant 12 side of the second encapsulant 24. This corresponds to the second protective member 26 being laminated on the negative direction side of the z-axis of the second encapsulant 24. As a back sheet, the second protective member 26 protects the back surface 92 of the solar cell module 100. For the second protective member 26, a resin film of PET (polyethylene terephthalate) or the like, or a laminated film including aluminum foil sandwiched between resin films may be used. On the second protective member 26, an opening portion penetrating in the z direction, not illustrated, is provided.

The terminal box 28 is formed in a rectangular parallelepiped shape and attached to the back surface 92 side of the second protective member 26, with an adhesive including silicon or the like, so as to cover the opening portion of the second protective member 26. Within the terminal box 28, electric outputs from the multiple solar cells 18 are derived. The two connection cables 30 are connected to the terminal box 28 to transmit the electric outputs from the multiple solar cells 18. To the tip of each connection cable 30, the corresponding connection plug 32 is connected.

Figure 3:
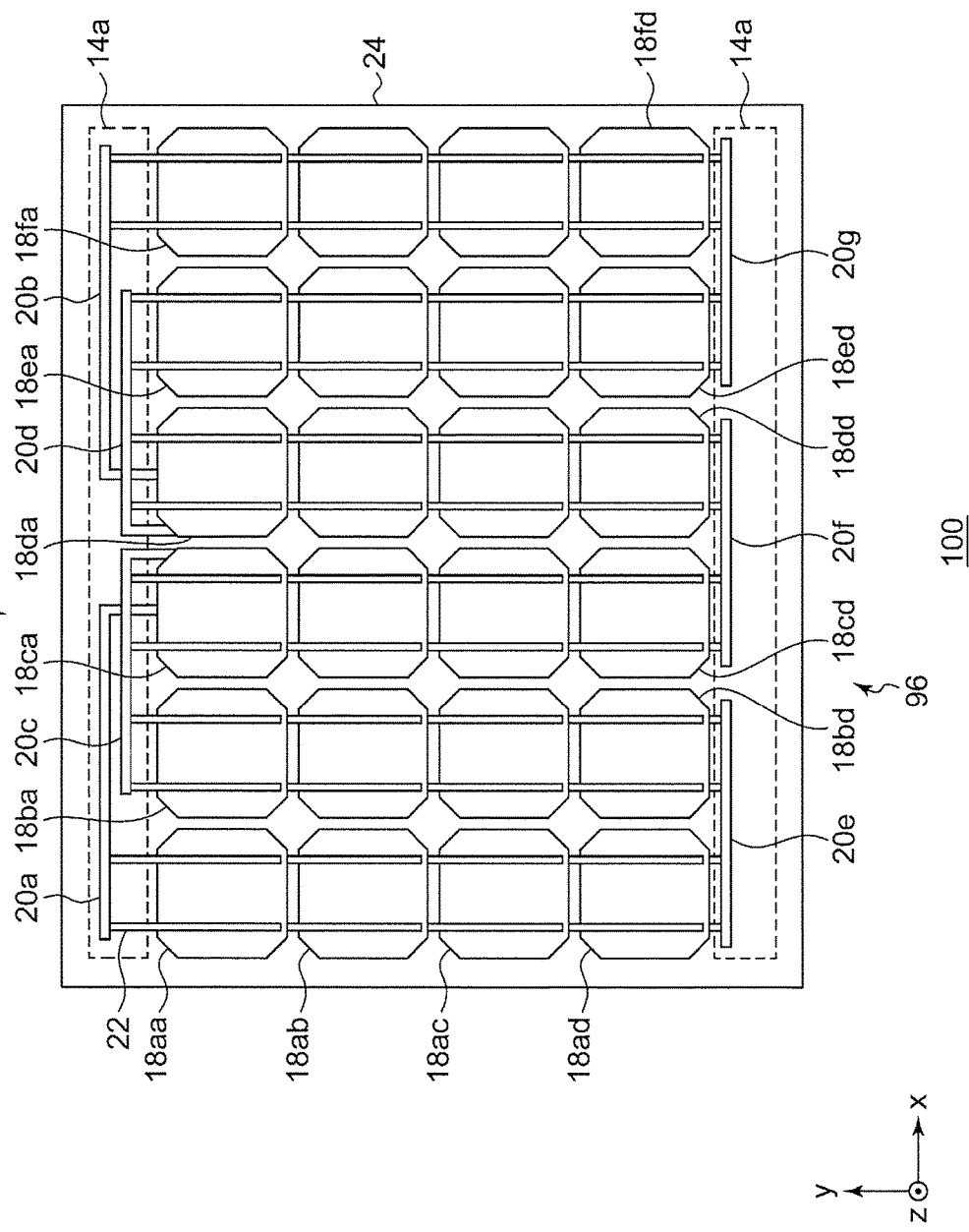
FIG. 3 is a plan view of the solar cell module shown in FIG. 1 viewed from the light-receiving surface side.

FIG. 3 is a plan view of the solar cell module 100 viewed from the light-receiving surface 90 side. In FIG. 3, the first protective member 10, first encapsulant 12, and connecting tab wire encapsulants 16 are not illustrated, in order to show the internal structure. The areas where the connecting tab wire covers 14 are to be arranged are indicated by dotted lines. On each of the solar cells 18, multiple finger electrodes extending in the x direction, not illustrated, are provided. In addition, bus bar electrodes extending in the y direction, which are substantially perpendicular to the multiple finger electrodes, are also provided on each of the solar cells 18. Further, tab lines 22 are attached so as to overlap with bus bar electrodes. Tab lines 22 connect bus bar electrodes on the light-receiving surface 90 side of one of adjacent solar cells 18, and bus bar electrodes on the back surface 92 side of the other. For example, the two tab lines 22 for connecting the 11th solar cell 18*aa* and a 12th solar cell 18*ab* electrically connect the light-receiving surface 90 side of the 12th solar cell 18*ab* and the back surface 92 side of the 11th solar cell 18*aa*.

With the connection using the tab lines 22, the 11th solar cell 18*aa*, the 12th solar cell 18*ab*, the 13th solar cell 18*ac*, and the 14th solar cell 18*ad* are connected in series, so that a group is formed in the y-axis direction. Similar groups are formed for the other solar cells 18, so that six groups are aligned in the x-axis direction in FIG. 3. The group including the 11th solar cell 18*aa* and the group including the 21st solar cell 18*ba* are connected to the fifth connecting tab wire 20*e* on the opposite reference side 96. Such two groups electrically connected in series form a string. Similarly, with the sixth connecting tab wire 20*f* and the seventh connecting tab wire 20*g*, other two strings are formed. Each string is connected to the terminal box 28, not illustrated in FIG. 3, via the first connecting tab wire 20*a* through the fourth connecting tab wire 20*d*.

As shown in FIG. 3, the three connecting tab wires 20 of the fifth connecting tab wire 20*e* through the seventh connecting tab wire 20*g* are arranged substantially linearly on the opposite reference side 96. The "substantially" means that a margin of error is included. Meanwhile, on the reference side 94, the third connecting tab wire 20*c* and the fourth connecting tab wire 20*d* are arranged substantially linearly and, in parallel therewith, the first connecting tab wire 20*a* and the second connecting tab wire 20*b* are arranged substantially linearly. Namely, connecting tab wires 20 are arranged in two rows on the reference side 94, whereas connecting tab wires 20 are arranged in a row on the opposite reference side 96. With such arrangement, the distance between a solar cell 18 closest to the reference side 94 and a row of connecting tab wires 20 closest to the reference side 94 is longer than the distance between a solar cell 18 closest to the opposite reference side 96 and a connecting tab wire 20 closest to the opposite reference side 96.

In consideration of such arrangement of connecting tab wires 20, the dimension in the y direction of the second connecting tab wire cover 14*b* may be shorter than the dimension in the y direction of the first connecting tab wire cover 14*a*. In this example, in order to improve efficiency of manufacturing processes and to reduce manufacturing costs, the first connecting tab wire cover 14a and second connecting tab wire cover 14b are set to have the same size. Accordingly, the dimension in the y direction of the connecting tab wire covers 14 is determined so that the connecting tab wires 20 on the reference side 94 can be hidden.

Figure 4:
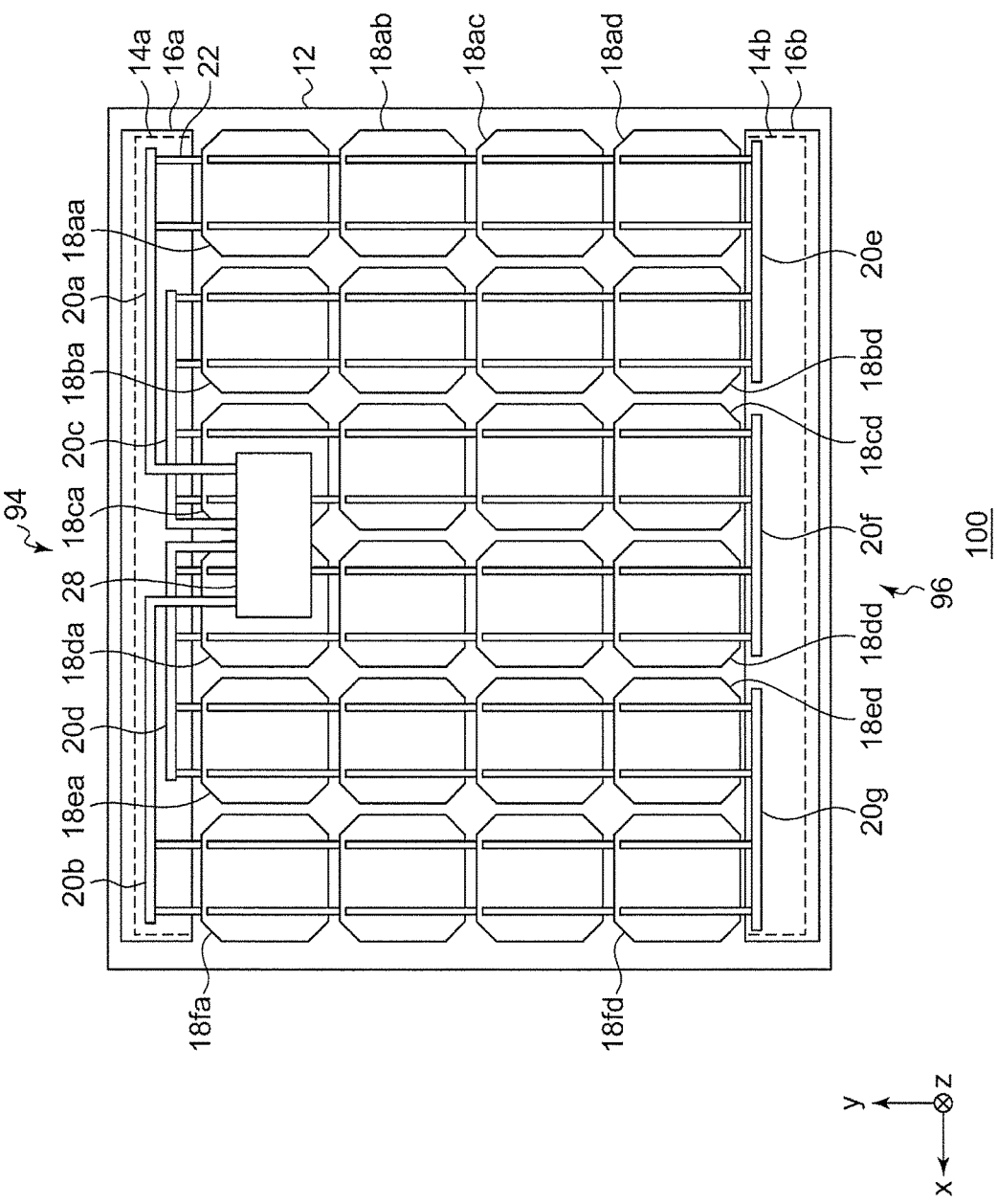
FIG. 4 is a plan view of the solar cell module shown in FIG. 1 viewed from the back surface side.

FIG. 4 is a plan view of the solar cell module 100 viewed from the back surface 92 side. In FIG. 4, the second encapsulant 24 and second protective member 26 are not illustrated. Similarly to the light-receiving surface 90 side, multiple finger electrodes extending in the x direction and bus bar electrodes extending in the y direction are provided on each of the solar cells 18. The number of finger electrodes provided on the back surface 92 side may be different from the number of finger electrodes provided on the light-receiving surface 90 side. As stated previously, each string is connected to the terminal box 28 via the first connecting tab wire 20a through the fourth connecting tab wire 20d. The terminal box 28 is provided to collect electricity generated by the solar cells 18.

The first connecting tab wire encapsulant 16a is laminated on the positive direction side of the z-axis of the first connecting tab wire 20a through the fourth connecting tab wire 20d, and the first connecting tab wire cover 14a is laminated on the positive direction side of the z-axis of the first connecting tab wire encapsulant 16a. Since the first connecting tab wire encapsulant 16a is larger than the first connecting tab wire cover 14a, as described previously, the first connecting tab wire cover 14a is supposed to be not shown; however, in order to clarify the arrangement, the first connecting tab wire cover 14a is indicated by dotted lines in FIG. 4. Each of the connecting tab wires 20 is not directly in contact with the first connecting tab wire cover 14a, as stated previously. The same applies to the opposite reference side 96.

In the following, a method for manufacturing the solar cell module 100 will be described.

FIG. 5 is a flowchart of a method for manufacturing the solar cell module 100 according to an embodiment.

(1) The first encapsulant 12 is laminated on the first protective member 10 from the negative direction of the z-axis.

(2) Multiple solar cells are laminated over a surface of the first encapsulant 12 (step S11). More specifically, the multiple solar cells 18 and connecting tab wires 20 connecting the solar cells 18 are laminated on the first encapsulant 12 from the negative direction of the z-axis.

(3) Through a slit formed on a connecting tab wire encapsulant 16, which has a wider size than a connecting tab wire cover 14, the connecting tab wire cover 14 and the connecting tab wire encapsulant 16 are fixed with a first tape (first fixing member) (step S12). The slit and the first tape will be described later.

(4) Between the first encapsulant 12 and connecting tab wires 20, the connecting tab wire cover 14 and connecting tab wire encapsulant 16 thus fixed are inserted, with the connecting tab wire cover 14 on the first encapsulant 12 side (step S13).

Figure 6A:
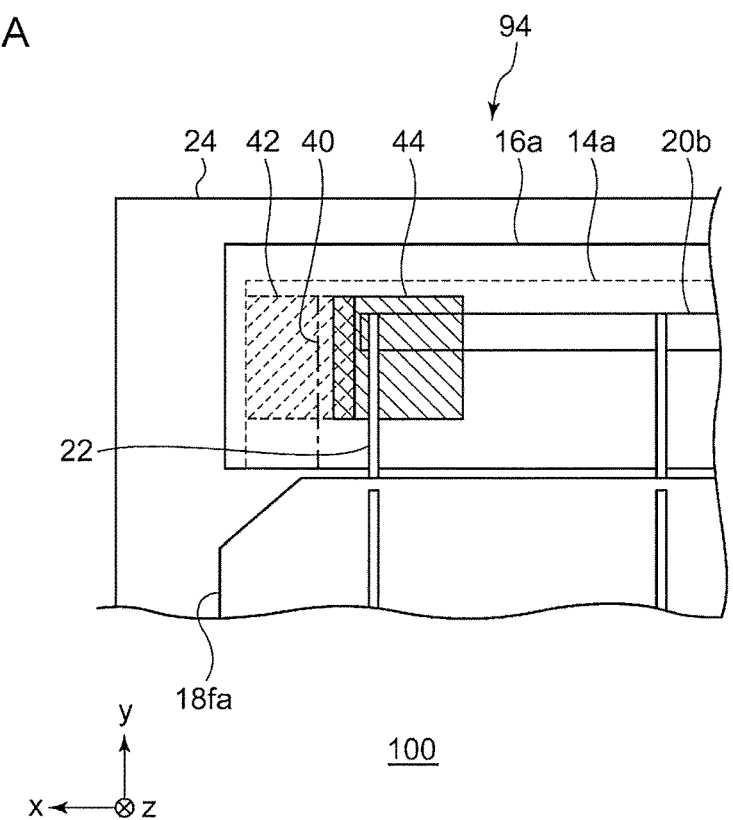
FIG. 6A is a partial plan view of the solar cell module viewed from the back surface side shown in FIG. 4.
Figure 6B:
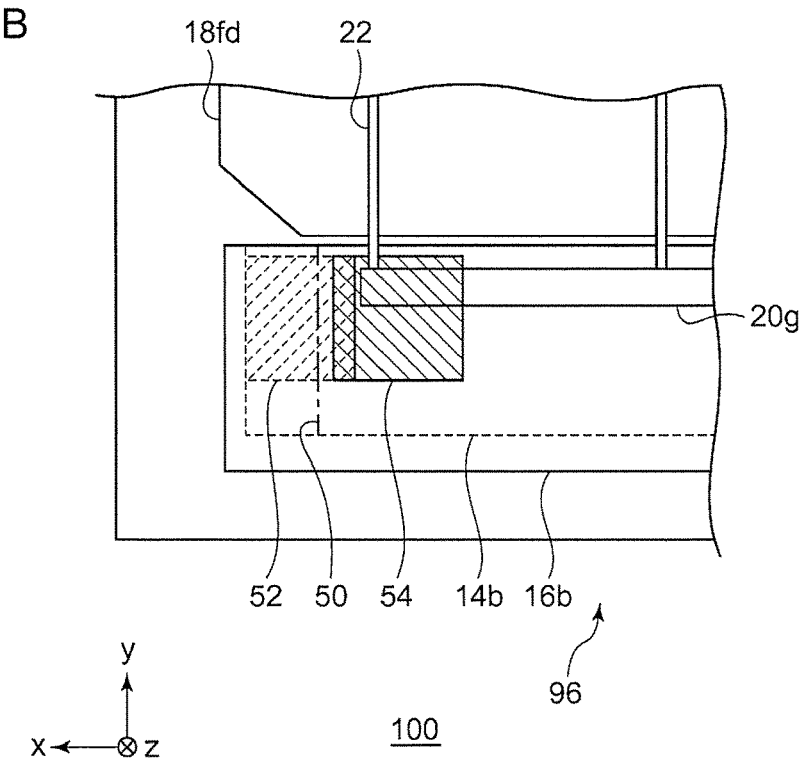
FIG. 6B is another partial plan view of the solar cell module viewed from the back surface side shown in FIG. 4.

The steps in sections (2) through (4) will be described in detail. On each of the first connecting tab wire encapsulant 16a and the second connecting tab wire encapsulant 16b, two slits are formed. Each of the slits faces the solar cells 18 side. FIGS. 6A and 6B are partial plan views of the solar cell module 100 viewed from the back surface 92 side. FIG. 6A is a partial plan view in which the vicinity of the 61st solar cell 18fa shown in FIG. 4 is magnified. The first connecting tab wire encapsulant 16a is arranged closer to the reference side 94 in relation to the 61st solar cell 18fa, and a slit 40 is provided on the first connecting tab wire encapsulant 16a so as to extend from the solar cells 18 side in the y-axis direction. The length of the slit 40 is set to be longer than half the dimension in the y-axis direction of the first connecting tab wire encapsulant 16a. The same slit is also provided at the other end of the first connecting tab wire encapsulant 16a on the negative direction side of the x-axis.

FIG. 6B is a partial plan view in which the vicinity of the 64th solar cell 18fd shown in FIG. 4 is magnified. The second connecting tab wire encapsulant 16b is arranged closer to the opposite reference side 96 in relation to the 64th solar cell 18fd, and a slit 50 is provided on the second connecting tab wire encapsulant 16b so as to extend from the solar cells 18 side in the y-axis direction. Similarly to the slit 40, the length of the slit 50 is set to be longer than half the dimension in the y-axis direction of the second connecting tab wire encapsulant 16b. The same slit is also provided at the other end of the second connecting tab wire encapsulant 16b on the negative direction side of the x-axis.

In FIG. 6A, the first connecting tab wire cover 14a and the first connecting tab wire encapsulant 16a are fixed with a first tape 42 through the slit 40, which corresponds to the aforementioned step in section (3). The first tape 42 has an adhesive surface on which an adhesive is applied, and the adhesive surface is stuck on the first connecting tab wire cover 14a and the first connecting tab wire encapsulant 16a. The first tape 42 may be PET (polyethylene terephthalate) tape made by applying an adhesive on one surface of a PET material, for example.

Figure 7:
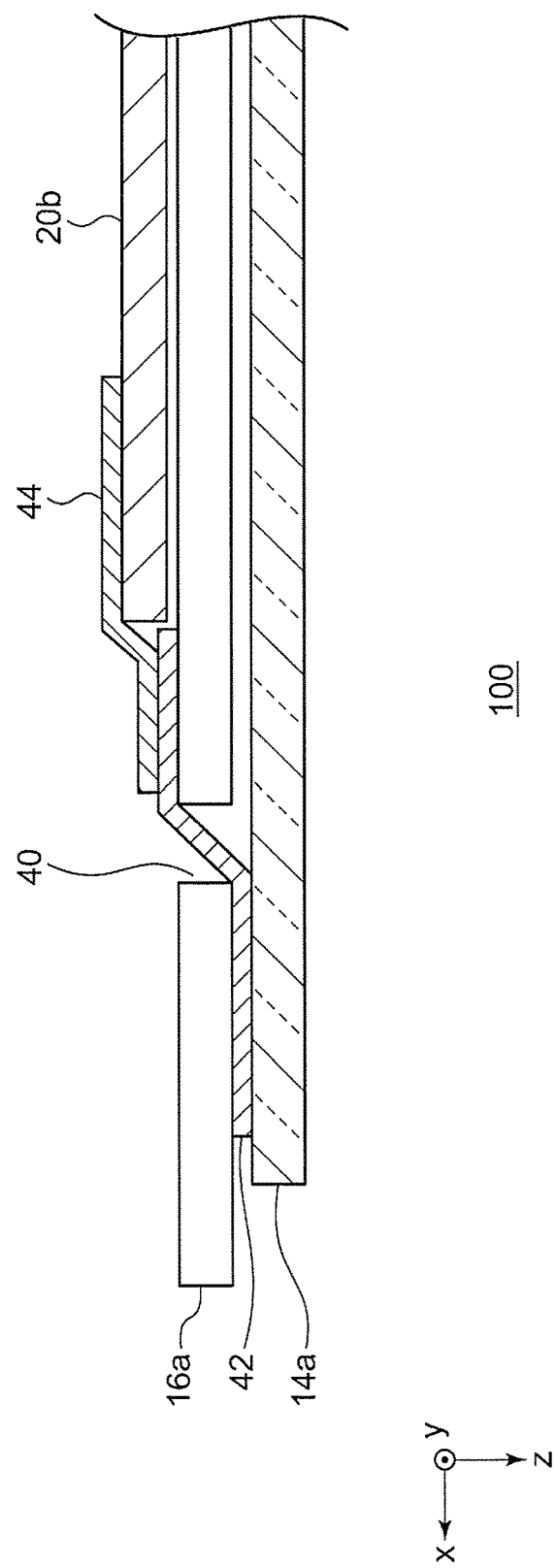
FIG. 7 is a partial sectional view of the solar cell module shown in FIG. 6A taken along the x-axis.

FIG. 7 is a partial sectional view of the solar cell module 100 shown in FIG. 6A taken along the x-axis. The sectional view of FIG. 7 is viewed from the positive direction side of the y-axis. As shown in FIG. 7, the first connecting tab wire cover 14a is arranged to extend in the x-axis direction, and the first connecting tab wire encapsulant 16a is also arranged to extend in the x-axis direction and on the negative direction side of the z-axis in relation to the first connecting tab wire cover 14a. On the first connecting tab wire encapsulant 16a is provided the slit 40, through which the first tape 42 is stuck on the first connecting tab wire cover 14a and the first connecting tab wire encapsulant 16a. Also, in FIG. 6B, the second connecting tab wire cover 14b and the second connecting tab wire encapsulant 16b are fixed with a first tape 52 through the slit 50. As with the first tape 42, the first tape 52 also has an adhesive surface on which an adhesive is applied and may be PET tape made by applying an adhesive on one surface of a PET material, for example. This process is performed before the solar cell module is supplied to a manufacturing line in a manufacturing plant.

(5) The connecting tab wire cover 14 and connecting tab wire encapsulant 16 thus fixed and a connecting tab wire 20 are further fixed with a second tape (second fixing member) (step S14). In FIG. 6A, the first connecting tab wire encapsulant 16a and the second connecting tab wire 20b are fixed with a second tape 44. The second tape 44 is stuck on the first tape 42, which is already stuck, so as to be fixed to the first connecting tab wire encapsulant 16a. As with the first tape 42, the second tape 44 also has an adhesive surface on which an adhesive is applied and may be PET tape made by applying an adhesive on one surface of a PET material, for example. In FIG. 7, the first tape 42 is stuck on the first connecting tab wire encapsulant 16a, and the second tape 44 is stuck on the surface of the first tape 42 on the negative direction side of the z-axis. The second tape 44 is also stuck on the second connecting tab wire 20b on the negative direction side of the z-axis.

In FIG. 6B, the second connecting tab wire encapsulant 16*b* and the seventh connecting tab wire 20*g* are fixed with a second tape 54. The second tape 54 is stuck on the first tape 52, which is already stuck, so as to be fixed to the second connecting tab wire encapsulant 16*b*. This process is performed after the solar cell module is supplied to a manufacturing line in a manufacturing plant. By performing two-step fixing of the fixing with the first tape 42 or the like and the fixing with the second tape 44 or the like, a connecting tab wire cover 14 and a connecting tab wire 20 are fixed by fixing members of a combination of the first tape 42 and second tape 44, for example, through the slit 40 or the like formed on a connecting tab wire encapsulant 16.

(6) The second encapsulant 24 is laminated on the first encapsulant 12 from the negative direction of the z-axis. Accordingly, the first tape 42 and the likes, the second tape 44 and the likes, the multiple solar cells 18, the connecting tab wire encapsulants 16, and the connecting tab wire covers 14 are sealed by the first encapsulant 12 and the second encapsulant 24.

(7) The second protective member 26 is laminated on the second encapsulant 24 from the negative direction of the z-axis. Thus, through the processes above, a laminated body, in which the first protective member 10 through the second protective member 26 are laminated, is formed.

(8) The laminated body is set to a laminator, and a lamination process is performed. In the lamination process, the laminated body is pressurized under diminished pressure, so that the air in the laminated body is removed.

(9) After the lamination process, a curing process is performed. In the curing process, the laminated body is heated to be unified.

(10) The terminal box 28 is attached to the unified laminated body with an adhesive from the negative direction of the z-axis so as to cover the opening portion provided on the second protective member 26 of the laminated body.

Figure 8A:
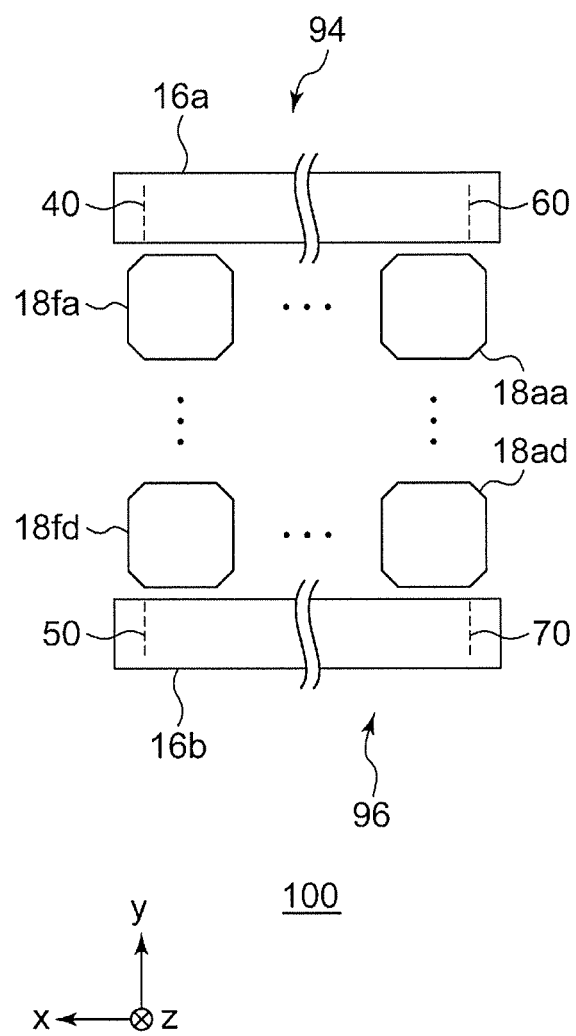
FIG. 8A is a plan view that shows a modification of the solar cell module shown in FIGS. 6A and 6B.
Figure 8C:
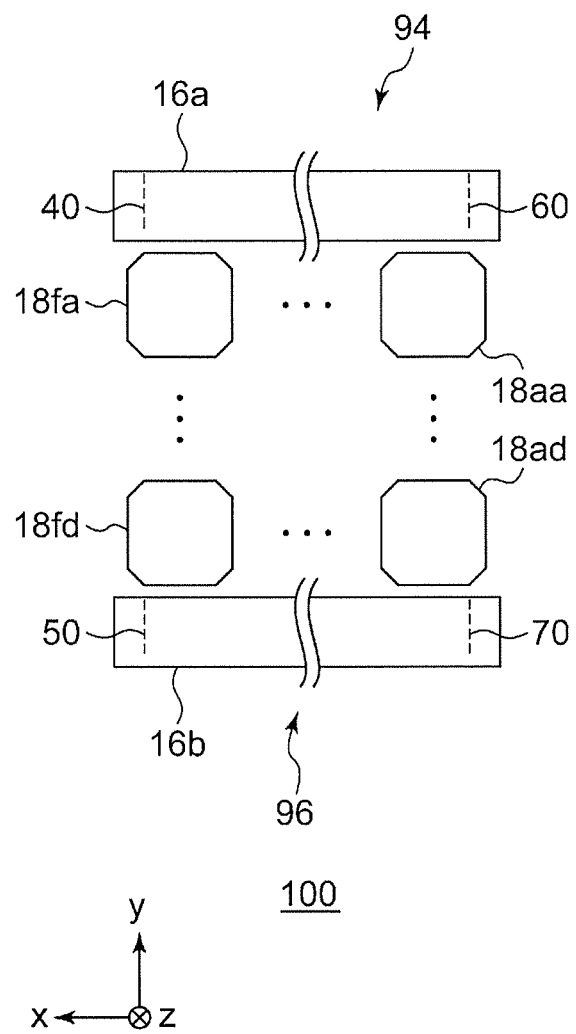
FIG. 8C is a plan view that shows yet another modification of the solar cell module shown in FIGS. 6A and 6B.

FIGS. 8A-8C are plan views that show modifications of the solar cell module 100. As with FIG. 4, FIGS. 8A-8C are plan views of the solar cell module 100 viewed from the back surface 92 side, but only the multiple solar cells 18 and the connecting tab wire encapsulants 16 are illustrated therein in order to show the positions of the slits. In FIG. 8A, the slits are arranged at the same positions as described previously. As shown in FIG. 8A, the slit 40 and a slit 60 are provided on the first connecting tab wire encapsulant 16*a* so as to face the solar cells 18 side. Also, the slit 50 and a slit 70 are provided on the second connecting tab wire encapsulant 16*b* so as to face the solar cells 18 side.

In FIG. 8B, the slits are arranged so as to face the side opposite to the solar cells 18 side, unlike in FIG. 8A. As shown in FIG. 8B, both the slits 40 and 60 provided on the first connecting tab wire encapsulant 16*a* face the side opposite to the solar cells 18 side. Also, both the slits 50 and 70 provided on the second connecting tab wire encapsulant 16*b* face the side opposite to the solar cells 18 side. In FIG. 8C, the side faced by the slits is different between the first connecting tab wire encapsulant 16*a* and the second connecting tab wire encapsulant 16*b*, unlike in FIGS. 8A and 8B. As shown in FIG. 8C, both the slits 40 and 60 provided on the first connecting tab wire encapsulant 16*a* face the side opposite to the solar cells 18 side. Meanwhile, both the slits 50 and 70 provided on the second connecting tab wire encapsulant 16*b* face the solar cells 18 side.

According to the embodiments, since connecting tab wire covers and connecting tab wires are fixed by fixing members through slits formed on connecting tab wire encapsulants, even if the connecting tab wire encapsulants are wider than the connecting tab wire covers, dislocation of the connecting tab wire covers can be prevented. Since dislocation of the connecting tab wire covers can be prevented, connecting tab wires can be hidden by the connecting tab wire covers. Also, since connecting tab wires can be hidden by the connecting tab wire covers, the connecting tab wires can be made indistinctive when the solar cell module is viewed from the light-receiving surface side. Since the connecting tab wires can be made indistinctive, the appearance of the solar cell module can be improved. Further, since the connecting tab wire encapsulants are made wider than the connecting tab wire covers, the reliability of the solar cell module can also be improved.

Also, since the slits formed on the laminated connecting tab wire encapsulants face the solar cells side, application of tapes through the slits can be facilitated. Since the size of the connecting tab wire encapsulants is limited to one size, preparation of the connecting tab wire encapsulants can be facilitated. Also, since the size of the connecting tab wire encapsulants is limited to one size, the manufacturing costs of the connecting tab wire encapsulants can be reduced. Since the connecting tab wire covers and the connecting tab wire encapsulants are fixed with the first tapes through the slits before the solar cell module is supplied to a manufacturing line, and since the connecting tab wire encapsulants and connecting tab wires are fixed with the second tapes after the solar cell module is supplied to the manufacturing line, the application of the tapes can be facilitated. Since the application of the tapes can be facilitated, the manufacturing process of the solar cell module can be simplified. Further, even if there are various ways of arrangement of apparatuses in the manufacturing process, since the slits can be provided at various positions with respect to the solar cells, the application of the tapes can be facilitated.

The present invention has been described with reference to embodiments. The embodiments are intended to be illustrative only, and it will be obvious to those skilled in the art that various modifications to a combination of constituting elements or processes could be developed and that such modifications also fall within the scope of the present invention.

The outline of the present embodiment is as follows. An embodiment relates to a method for manufacturing a solar cell module 100 in which a first encapsulant 12 and a second encapsulant 24 are provided between a first protective member 10 and a second protective member 26, and solar cells 18 are provided between the first encapsulant 12 and the second encapsulant 24. The method comprises: laminating the multiple solar cells 18 over a surface of the first encapsulant 12; fixing a connecting tab wire cover 14 and a connecting tab wire encapsulant 16 with a first tape (first fixing member) 42, through a slit 40 formed on the connecting tab wire encapsulant 16 having a wider size than the connecting tab wire cover 14; inserting the connecting tab wire cover 14 and the connecting tab wire encapsulant 16 thus fixed between the first encapsulant 12 and a connecting tab wire 20 for connecting multiple solar cells 18, with the connecting tab wire cover 14 on the first encapsulant 12 side; and fixing the connecting tab wire cover 14 and the connecting tab wire encapsulant 16 thus fixed and the connecting tab wire 20 with a second tape (second fixing member) 44.

In the inserting, the connecting tab wire cover 14 and the connecting tab wire encapsulant 16 may be inserted so that the slit 40 formed on the connecting tab wire encapsulant 16 faces the solar cells 18 side.

Another embodiment is a solar cell module 100. In the solar cell module 100, a first encapsulant 12 and a second encapsulant 24 are provided between a first protective member 10 and a second protective member 26, and solar cells 18 are provided between the first encapsulant 12 and the second encapsulant 24. The solar cell module 100 comprises: a connecting tab wire cover 14 laminated on a surface of the first encapsulant 12; a connecting tab wire encapsulant 16 laminated on the surface opposite to the first encapsulant 12 side of the connecting tab wire cover 14; multiple solar cells 18 laminated over a surface of the first encapsulant 12; and fixing members 42 and 44 that fix, through a slit 40 formed on the connecting tab wire encapsulant 16 having a wider size than the connecting tab wire cover 14, the connecting tab wire cover 14 and a connecting tab wire 20, which is provided on the surface opposite to the connecting tab wire cover 14 side of the connecting tab wire encapsulant 16 and is used to connect multiple solar cells 18.

The fixing members 42 and 44 may include: a first fixing member 42 that fixes the connecting tab wire cover 14 and the connecting tab wire encapsulant 16 through the slit 40 formed on the connecting tab wire encapsulant 16; and a second fixing member 44 that fixes the connecting tab wire encapsulant 16 and the connecting tab wire 20.

A method for manufacturing a solar cell module and a solar cell module manufactured using the method according to the present invention have been described based on the embodiments above. However, the present invention is not limited to the embodiments. It is to be understood that various modifications may be made to the embodiments by those skilled in the art and arbitrary combinations of constituting elements or functions in the embodiments may be made without departing from the scope of the invention and that such modifications and combinations are also within the scope of the present invention.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module in which a first protective member, a first encapsulant, a plurality of solar cell strings each including a plurality of solar cells, a second encapsulant, and a second protective member are arranged in order, the solar cell module comprising:
   a connecting tab wire arranged between the first encapsulant and the second encapsulant and arranged not to overlap the plurality of solar cells in a direction from the first protective member toward the second protective member, the connecting tab wire connecting two of the plurality of solar cell strings and is disposed within an outer boundary of the solar cell module;
   a connecting tab wire cover arranged between the first encapsulant and the second encapsulant and arranged not to overlap the plurality of solar cells in the direction from the first protective member toward the second protective member;
   a connecting tab wire encapsulant arranged between the first encapsulant and the second encapsulant and arranged not to overlap the plurality of solar cells in the direction from the first protective member toward the second protective member;
   a plurality of fixing members arranged between the first encapsulant and the second encapsulant the plurality of fixing members arranged not to overlap the plurality of solar cells in the direction from the first protective member toward the second protective member, wherein
   the connecting tab wire encapsulant is disposed between the connecting tab wire and the first encapsulant, and has a wider size than the connecting tab wire cover,
   the connecting tab wire cover is disposed between the connecting tab wire encapsulant and the first encapsulant, and
   wherein the plurality of fixing members includes a first fixing member and a second fixing member, the first fixing member comprising a first portion and a second portion,
   the first portion of the first fixing member being disposed between the connecting tab wire cover and the connecting tab wire encapsulant, the second fixing member being disposed on the connecting tab wire, and
   the second portion of the first fixing member penetrates through a slit in the connecting tab wire encapsulant so that the second portion of the first fixing member extends between and connects the first portion of the first fixing member and the second fixing member.

2. The solar cell module according to claim 1, wherein the connecting tab wire cover is a same color as the second protective member and the second encapsulant, when the solar cell module is viewed from the first protective member.

3. The solar cell module according to claim 1, wherein the first fixing member and the second fixing member each comprise a resin tape and an adhesive on the resin tape.

4. A solar cell module comprising:
   a first solar cell string includes a first solar cell;
   a second solar cell string includes a second solar cell;
   a connecting tab wire connects one end of the first solar cell string and one end of the second solar cell string;
   a connecting tab wire encapsulant provided on the connecting tab wire and arranged not to overlap the first solar cell and the second solar cell in a plan view;
   a connecting tab wire cover provided on the connecting tab wire encapsulant and arranged not to be overlap the first solar cell and the second solar cell in a plan view;
   a first fixing member in between the connecting tab wire cover and the connecting tab wire encapsulant; and
   a second fixing member in between the first fixing member and the connecting tab wire, wherein
   the first fixing member comprises a first portion sandwiched between the connecting tab wire cover and the connecting tab wire encapsulant, and a second portion sandwiched by the connecting tab wire encapsulant and the second fixing member, and
   the first fixing member penetrates through the connecting tab wire encapsulant to connect to the second fixing member.

5. The solar cell module according to claim 4, further comprising a first protective member, a first encapsulant, a second encapsulant, and a second protective member are arranged in this order, wherein
   the first and second solar cell strings, the connecting tab wire, the connecting tab wire encapsulant, the connecting tab wire cover, and the first and second fixing members are arranged between the first encapsulant and the second encapsulant.

6. The solar cell module according to claim 4, wherein the first fixing member and the second fixing member each comprise a resin tape and an adhesive on the resin tape.

7. The solar cell module according to claim 5, wherein the connecting tab wire cover is a same color as the second protective member and the second encapsulant, when the solar cell module is viewed from the first protective member.

* * * * *